United States Patent [19]

Hiraki et al.

[11] Patent Number: 4,542,400

[45] Date of Patent: Sep. 17, 1985

[54] SEMICONDUCTOR DEVICE WITH MULTI-LAYERED STRUCTURE

[75] Inventors: Shunichi Hiraki, Yokohama; Kuniaki Kumamaru, Chigasaki; Yutaka Koshino; Toshio Yonezawa, both of Yokosuka, all of Japan

[73] Assignee: Tokyo Shibaura Denki Kabushiki Kaisha, Japan

[21] Appl. No.: 528,473

[22] Filed: Sep. 1, 1983

Related U.S. Application Data

[63] Continuation of Ser. No. 176,290, Aug. 8, 1980, abandoned.

[30] Foreign Application Priority Data

Aug. 15, 1979 [JP] Japan ................... 54-103695

[51] Int. Cl.$^4$ .............. H01L 29/34; H01L 29/40; H01L 23/30
[52] U.S. Cl. ................................. 357/54; 357/52; 357/53; 357/73
[58] Field of Search .............. 357/52 C, 53, 54 A, 357/54 R, 54 G, 54 N

[56] References Cited

U.S. PATENT DOCUMENTS

| | | | |
|---|---|---|---|
| 3,226,611 | 12/1965 | Haenichen | 357/54 |
| 3,649,886 | 3/1972 | Kooi | 357/54 |
| 3,730,766 | 5/1973 | Nishimotsu et al. | 357/54 |
| 3,767,463 | 10/1973 | Aboaf et al. | 357/52 |
| 3,912,559 | 10/1975 | Harigaya et al. | 357/54 |
| 3,922,709 | 11/1975 | Wallmark et al. | 357/54 |
| 3,967,310 | 6/1976 | Horiuchi et al. | 357/54 |
| 4,060,827 | 11/1977 | Ono et al. | 357/54 |

FOREIGN PATENT DOCUMENTS

| | | |
|---|---|---|
| 1589901 | 10/1970 | Fed. Rep. of Germany . |
| 1910746 | 11/1970 | Fed. Rep. of Germany . |
| 2214996 | 10/1972 | Fed. Rep. of Germany . |
| 2513459 | 10/1975 | Fed. Rep. of Germany . |

OTHER PUBLICATIONS

Gregor, "Controlling the Potential at a Semiconductor Surface", *IBM Technical Disclosure Bulletin*, vol. 11, No. 2, Jul. 1968, pp. 118–119.

J. F. Shepard et al., "Charge Control in Selected Areas of SiO$_2$", *IBM Technical Disclosure Bulletin*, vol. 15, (1972), p. 1344.

*Primary Examiner*—Andrew J. James
*Assistant Examiner*—J. Carroll
*Attorney, Agent, or Firm*—Finnegan, Henderson, Farabow, Garrett & Dunner

[57] ABSTRACT

A semiconductor device comprising a substrate means, a semiconductor layer of an N conductivity type formed on the substrate means, a first semiconductor region of a P conductivity type formed in the semiconductor layer and having its exposed major surface, a second semiconductor region of the N conductivity type formed in the first semiconductor region and having its exposed major surface, a first insulation layer means having a positive polarity type of charge and formed on the N semiconductor layer, and a second insulation layer means having a negative polarity type of charge and formed on the P semiconductor region.

12 Claims, 17 Drawing Figures

SEMICONDUCTOR DEVICE WITH MULTI-LAYERED STRUCTURE

This is a continuation of application Ser. No. 176,290, filed Aug. 8, 1980, now abandoned.

BACKGROUND OF THE INVENTION

The present invention relates to a semiconductor device with an improved multi-layered insulation structure formed on a semiconductor body.

In a semiconductor device, for example, in a bipolar transistor, the main factors which influence the withstand voltage characteristics and the reliability of operation are: the kinds of insulation layers formed in a multi-layered structure on the semiconductor body, the thickness of each insulation layer, the structure of the insulation layers, the blocking performance of each insulation layer against external impurities such as water, the method of formation of the insulation layers and so on.

In order to improve the withstand voltage characteristics and the reliability of operation, many steps have been conventionally taken for decreasing the field strength by making the insulation layer formed on the semiconductor body thicker, for forming a separating region for eliminating generation of channels, for forming an insulation layer of high blocking ability against impurities and so on.

However, when the insulation layer is made thicker, several problems arise; a thick insulation layer makes an aluminum layer on it discontinuous at a thick stepped portion and the blocking ability against external impurities is reduced. When a separation region is formed for preventing the generation of channels, the required chip area is made greater and the packing density is degraded. When an insulation layer of a high blocking ability is formed, the diffusion of impurities introduced from outside into the insulation layers and the semiconductor body may indeed be prevented. However, since an insulation layer of such a high blocking performance has a large amount of charge, an inversion layer is apt to be formed in the surface region of the semiconductor body. This not only increases the leakage current but also results in actuation of parasitic elements. This might eventually lead to a breakdown of the semiconductor device and degradation of the reliability of its operation.

SUMMARY OF THE INVENTION

The present invention has been made to overcome these problems of the prior art and has for an object to provide a semiconductor device wherein the withstand voltage characteristics is improved without causing increased insulation layer thickness enlargement of the required chip area, formation of an inversion layer and so on.

It is another object of the present invention to provide a semiconductor device with improved reliability of its operation.

It is still another object of the present invention to provide a semiconductor device with higher packing density.

In order to achieve the above and other objects, the present inventors have conducted extensive research and have learned the following facts.

Lengthy studies have been conducted from various viewpoints about the phenomenon of an formation of inversion layer and the following results have been revealed. Although it is generally recognized that the formation of an insulation layer more or less induces an inherent charge in the layer or in the vicinity of the surface of the layer, the formation of an insulation layer with high blocking ability against external impurities results in a greater inherent induced charge. The inherent charge of such an insulation layer may be positive or negative, and the influence of this positive or negative charge is related to the conductivity type of the semiconductor region which corresponds to the position where the insulation layer is formed.

From the above facts, the present inventors have succeeded in providing a semiconductor device wherein the inherent induced charge is suppressed to an acceptable range and the generation of an inversion layer is eliminated, thereby preventing the leakage current from increasing and consequently improving the reliability and the withstand voltage characteristics of the device. This is accomplished by forming on a p-type semiconductor region an insulation layer which has negative charge and a high blocking performance against external impurities, and forming on an n-type semiconductor region an insulation layer which has positive charge and a high blocking performance against external impurities.

Thus, the present invention provides a semiconductor device with p-type and n-type semiconductor regions exposed on the major surface of the semiconductor body wherein an insulation layer of negative charge is formed on said p-type region with at least one insulation layer interposed therebetween.

DETAILED DESCRIPTION OF THE PREFERRED EMBODIMENTS

Figure 1:
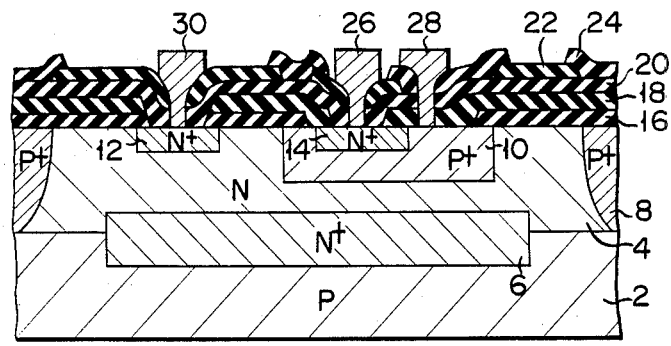
FIG. 1 is a view illustrating a semiconductor device in accordance with an embodiment of the present invention.

FIG. 1 shows the structure of a bipolar transistor device to which the present invention is applied.

In the semiconductor device shown in FIG. 1, an n-type semiconductor epitaxial layer 4 is formed on a p-type semiconductive substrate 2 and operates as collector of a transistor. An n+-type layer 6 is embedded between the substrate 2 and the n-type layer 4. A separation region 8 having p+-type is formed in the n-type layer 4. A p+-type diffusion region 10 constituting a base region is formed in the n-type region 4 surrounded by the p+-type region 8. An n+-type diffusion region 12 constitutes a contact region with external electrode. An n+-type diffusion region 14 constituting an emitter region is formed in the p+-type base region 10. The n-type collector region 4, the p+-type base region 10, and the n+-type emitter region 14 construct an npn type bipolar transistor.

An insulation layer 16 consisting of, for example, silicon oxide $SiO_2$ is selectively formed on the semiconductor body of such a structure. The $SiO_2$ layer has a thickness of about 3000 Å. An insulation layer 18 consisting of boron silicate glass (BSG) is formed on the insulation layer 16. The BSG layer 18 extends from on the $SiO_2$ layer 16 to on the p+-type base region 10 and the n+-type emitter region 14. The BSG layer 18 has a thickness of about 3000 Å. An insulation layer 20 consisting of phosphor silicate glass (PSG) is formed on the BSG layer 18. The PSG layer 20 extends from on the BSG layer 18 to on the n+-type emitter region 14. The PSG layer has the thickness of about 4000 Å. $SiO_2$, BSG and PSG have a positive charge of about $+2 \times 10^{10} \sim 3 \times 10^{11}/cm^2$. On the insulation layer 20, at the position where it corresponds to the n-type region of the semiconductor body, is formed an insulation layer 22 consisting of, for example, silicon nitride ($Si_3N_4$) which has a positive charge. The $Si_3N_4$ layer 22 is preferably formed to a thickness of 800–2,000 Å. $Si_3N_4$ has a positive charge of about $+1 \times 10^{12}/cm^2$ and has a high blocking performance against external impurities.

On the insulation layer 20, at the position where it corresponds to the p-type region, is formed an aluminum oxide layer ($Al_2O_3$) 24 which has a negative charge. The thickness of the $Al_2O_3$ layer 24, similarly as in the case of the $Si_3N_4$ layer 22, is preferably in the range of 800–2,000 Å. $Al_2O_3$ has a negative charge of about $-1 \times 10^{12}/cm^2$ and has a high blocking performance against external impurities. Contact holes are selectively formed in the multi-layered insulation structure and are formed over the n+-type emitter region 14, the p+-type base region 10 and the n+-type region 12. The n+-type emitter region 14, the p+-type base region 10 and the N+-type region 12 contact with an emitter electrode 26, a base electrode 28, and a collector electrode 30, respectively, through the contact holes.

In the semiconductor device of FIG. 1, an $Si_3N_4$ layer is formed over the n-type regions with the $SiO_2$ layer 16, the BSG layer 18 and the PSG layer 20 interposed therebetween. The inherent charge induced in the multi-layered insulation structure comprising the $SiO_2$ layer 16, the BSG layer 18, the PSG layer 20 and the $Si_3N_4$ layer 22 is mainly determined by the $Si_3N_4$ layer 22. As a whole it is a positive charge of about $+4 \times 10^{11} \sim +1 \times 10^{12}/cm^2$. The multi-layered insulation structure comprising the BSG layer 18, the PSG layer 20, and the $Si_3N_4$ layer 22 is formed on the n+-type emitter region 14 without the intermediacy of the $SiO_2$ layer 16. With this structure, the inherent charge also depends on the $Si_3N_4$ layer. Thus, the inherent charge of the entirety of the multi-layered structure is positive and about $+4 \times 10^{11} \sim +1 \times 10^{12}/cm^2$ as in the case of n-type region 4.

When the PSG layer 20 is partially directly formed on the n+-type region 12 and the n+-type emitter region 14 and the $Si_3N_4$ layer 22 is formed on the PSG layer 20, the inherent charge of this multi-layered structure is also dependent on the $Si_3N_4$ layer 22. The overall inherent charge is positive and is about $+4 \times 10^{11} \sim +1 \times 10^{12}/cm^2$.

An $Al_2O_3$ layer 24 is formed on the p-type regions with the $SiO_2$ layer 16, the BSG layer 18 and the PSG layer 20 interposed therebetween. The inherent charge in the multi-layered insulation structure comprising the $SiO_2$ layer 16, the BSG layer 18, the PSG layer 20 and the $Al_2O_3$ layer 24 mainly depends on the $Al_2O_3$ layer 24 and is a negative charge of less than $-1 \times 10^{11}/cm^2$ as a whole. The $Al_2O_3$ layer 24 is formed on the p+-type base region 10 partially without the intermediacy of the $SiO_2$ layer 16 and with the intermediacy of the BSG layer 18 and the PSG layer 20. With the multilayered structure comprising the BSG layer 18, the PSG layer 20 and the $Al_2O_3$ layer 24, the overall inherent induced charge is dependent on the $Al_2O_3$ layer 24 and is less than $-1 \times 10^{11}/cm^2$.

In the above embodiment, on the part of the PSG layer 20 corresponding to the n-type regions is formed an $Si_3N_4$ layer which has positive charge and has a high blocking performance against external impurities so as to control the overall charge of the multi-layered insulation structure over the regions 4, 12 and 14 to be more than $2 \times 10^{11}/cm^2$.

On the part of the PSG layer 20 where it corresponds to the p-type region is formed an $Al_2O_3$ layer which has negative charge and has a high blocking performance against external impurities so as to control the overall charge of the multilayered insulation structure over the p-type regions to be less than $-1 \times 10^{11}/cm^2$. By arranging the insulation layers in the above structure so as to control the overall charge on the insulation layer structures on the n-type region and on the p-type region to be within the above-mentioned range, the formation of an inversion layer at each region is prevented. Therefore, a channel is not formed in the semiconductor body and the generation of leakage current is consequently prevented. As a result, the operation is stable and the reliability and the withstand voltage characteristics are improved.

Charge amount of the multi-layered structure does not depend on its overall thickness.

Although the $SiO_2$ layer 16, the BSG layer 18 and the PSG layer 20, are formed as insulation layers with a small amount of charge between the semiconductor body and the $Si_3N_4$ layer 22 or the $Al_2O_3$ layer 24, the $SiO_2$ layer 16, the BSG layer 18 and the PSG layer 20 may not all have to be formed, but alternatively one or two of these may be formed.

Further, instead of the $Si_3N_4$ layer 22 a silicon oxynitride $Si_xO_yN_z$ layer may be formed. Substantially the same effects can be obtained when this $Si_xO_yN_z$ layer is used in place of the $Si_3N_4$ layer.

The method of manufacturing a semiconductor device as shown in FIG. 1 will now be described with reference to FIGS. 2–13.

Figure 2:
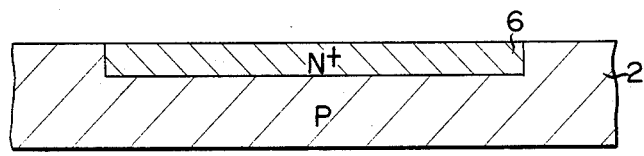
FIGS. 2–14 are views illustrating the process for manufacturing the semiconductor device of FIG. 1.
Figure 3:
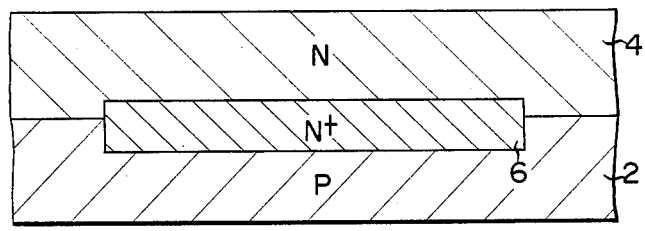
Figure 4:
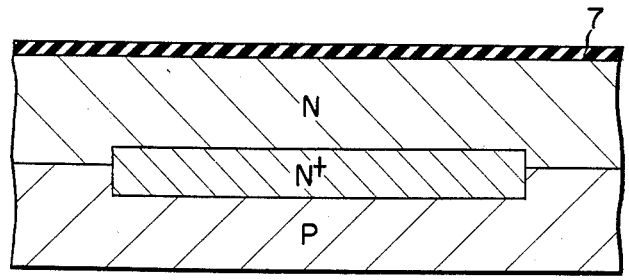
Figure 5:
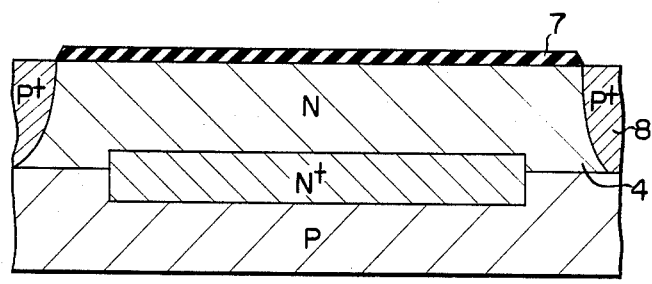
Figure 6:
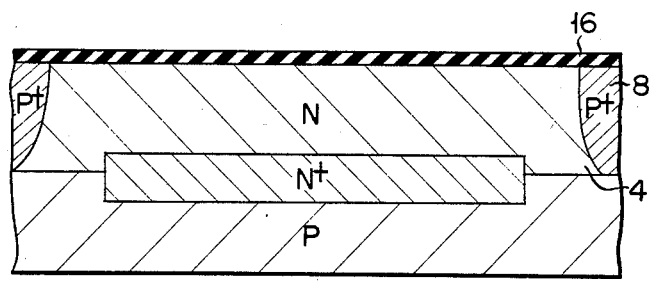

The p-type semiconductor substrate 2 is prepared and the n+-type region 6 is formed therein by, for example, diffusion of an impurity, as shown in FIG. 2. Then, the n-type epitaxial layer 4 is formed on the substrate 2, as shown in FIG. 3 by the epitaxial growth technique. An insulation layer 7, for example a $SiO_2$ layer, is formed on the n-type epitaxial layer 4 as shown in FIG. 4. Part of the insulation layer 7 is removed as shown in FIG. 5 and ions of, for example, boron are implanted in the n-type layer 4 through the exposed portion thereof so as to form the p+-type region 8 for element separation. After the insulation layer 7 is removed, the insulation layer 16, for example $SiO_2$ layer, is formed as shown in FIG. 6, with the thickness of 3000 Å. $SiO_2$ has a charge of about $+2 \times 10^{10}/cm^2$.

Figure 7:
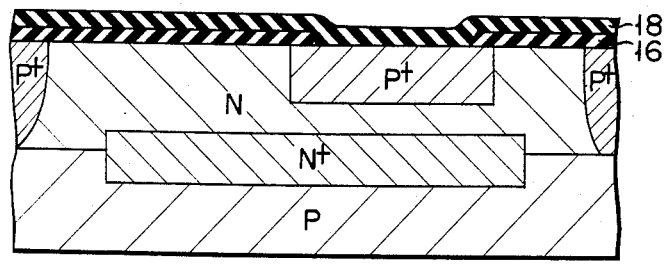
Figure 8:
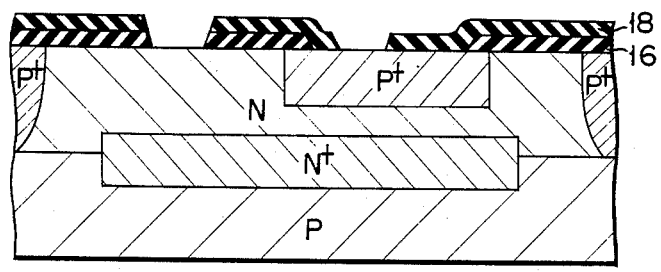
Figure 9:
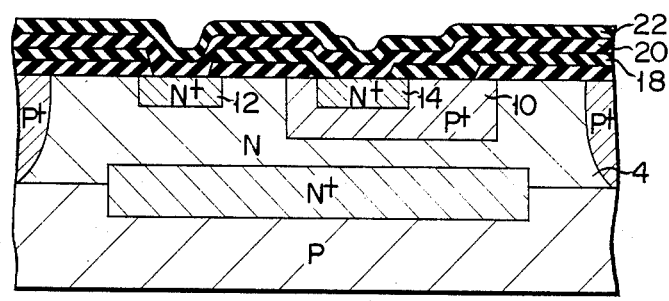

As shown in FIG. 7, after forming a hole at a predetermined part of the $SiO_2$ layer 16, the boron silicate glass (BSG) insulation layer 18 if formed by the chemical vapor deposition (CVD) method and is heated to a temperature of about 1,200° C. in a reducing atmosphere. Boron is thereby diffused from the BSG layer 18 into the n-type region 4 and forms the p+-type diffusion layer 10 as a base region in the n-type region 4 (FIG. 7). The BSG layer 18 has the thickness of about 3000 Å. BSG has a charge of about $+2\times 10^{10} \sim 3\times 10^{11}$/cm$^2$. After heating, the structure of the SiO$_2$ layer 16 and BSG layer 18 has a charge of about $1\times 10^{11} \sim 3\times 10^{11}$/cm$^2$ as a whole. After forming holes at predetermined positions as shown in FIG. 8, the phosphor silicate glass (PSG) layer 20 and the silicon nitride layer 22 are sequentially formed by the CVD method as shown in FIG. 9 and are heated to a temperature of about 1,200° C. in an oxidizing atmosphere. Then phosphor is diffused from the PSG layer 20 into the p+-type region 10 and the n-type region 4 and forms the n+-type regions 14 and 12 in the p+-type region 10 and the n-type region 4, respectively. The PSG layer 20 has a thickness of about 4000 Å. PSG has a charge of $+2\times 10^{10} \sim 3\times 10^{11}$/cm$^2$. After heating, the structure of the SiO$_2$ layer 16, BSG layer 18 and PSG layer 20 has a charge of about less than $+1\times 10^{11}$/cm$^2$ as a whole.

Figure 10:
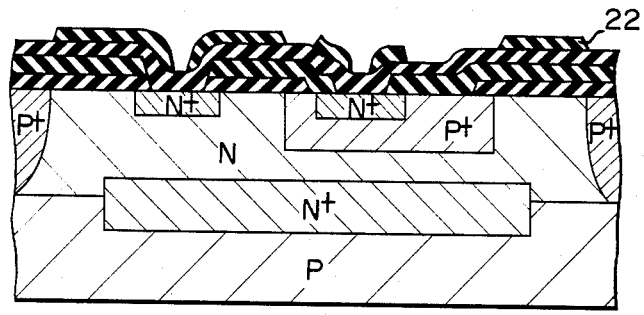

Then by the plasma etching method using CF$_4$+O$_2$ gas, the Si$_3$N$_4$ layer 22 is selectively removed as shown in FIG. 10 so that it is left in places corresponding to the n-type region 4 and the n+-type regions 12 and 14. Si$_3$N$_4$ has a charge of about $+1\times 10^{12}$/cm$^2$. The structure including the SiO$_2$ layer 16, BSG layer 18, PSG layer 20 and Si$_3$N$_4$ layer 22 has a charge of about $+4\times 10^{11} \sim +1\times 10^{12}$/cm$^2$ as a whole. Holes for forming a collector electrode and an emitter electrode are formed, respectively, on the parts of the Si$_3$N$_4$ layer 22 corresponding to the n+-type region 12 as a contact region of a collector region and on the n+-type region 14 as an emitter region.

Figure 11:
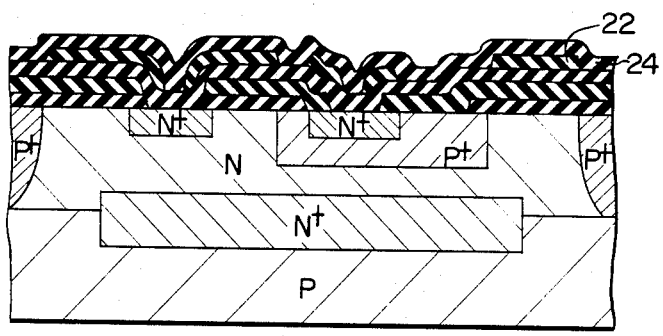
Figure 12:
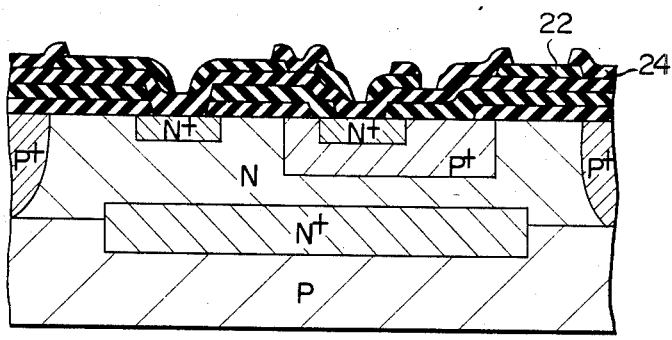
Figure 13:
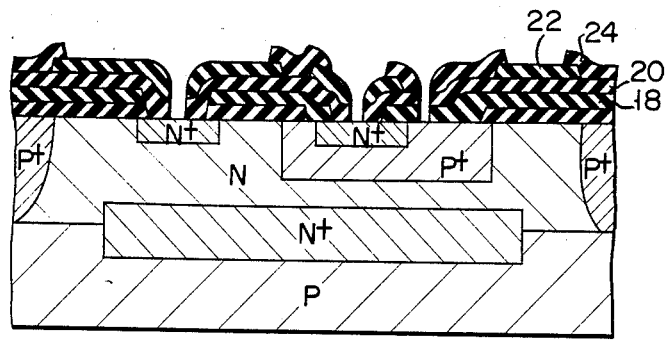
Figure 14:
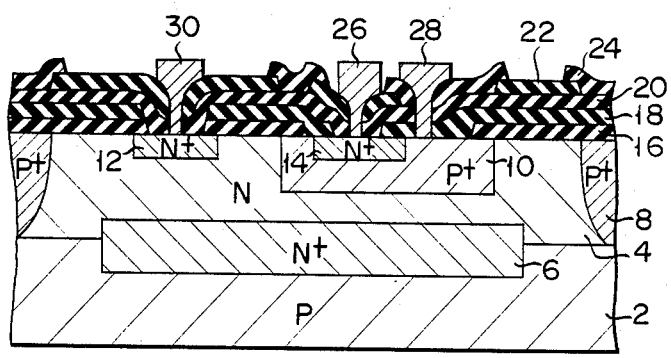

Then, an Al$_2$O$_3$ layer 24 is deposited to a thickness of about 1,000 Å by, for example, the CVD method as shown in FIG. 11. The Al$_2$O$_3$ insulation layer 24 is selectively etched away so that parts corresponding to the p+-type regions 8 and 10 are left as shown in FIG. 12. Al$_2$O$_3$ has a charge of about $-1\times 10^{12}$/cm$^2$. The structure including the SiO$_2$ layer 16, BSG layer 18, PSG layer 20 and Al$_2$O$_3$ layer 24 has a charge of less than $-1\times 10^{11}$/cm$^2$ as a whole. Then holes are formed in the parts of the PSG layer 20 corresponding to the N+-type regions 12 and 14 and holes are formed in the Al$_2$O$_3$ layer 24, the PSG layer 20 and the BSG layer 18 on the p+-type region 10. After an aluminum layer is formed and patterned, the emitter electrode 26, the base electrode 28 and the collector electrode 30 are formed in contact with the n+-type emitter region 14, the p+-type base region 10, and the n+-type collector contact region 12, respectively.

The semiconductor device as shown in FIG. 1 is thus manufactured. When the semiconductor device of this structure was put into operation, the formation of an inversion layer in the p-type regions and in the n-type regions are restrained as compared with the conventional structure having the same thickness, an increase in the leakage current was not noted, and the reliability and the withstand voltage characteristics were found to be improved. Furthermore, the blocking performance of the Si$_3$N$_4$ layer 22 and the Al$_2$O$_3$ layer 24 against external impurities was also found to be excellent, raising the reliability and the withstand voltage characteristics in this respect as well.

Further, in this embodiment, since the means for obtaining higher reliability and higher withstand voltage does not involve increasing the thickness of the insulation layer, the overall thickness of the multi-layered insulation structure may be advantageously made thinner.

Figure 15:
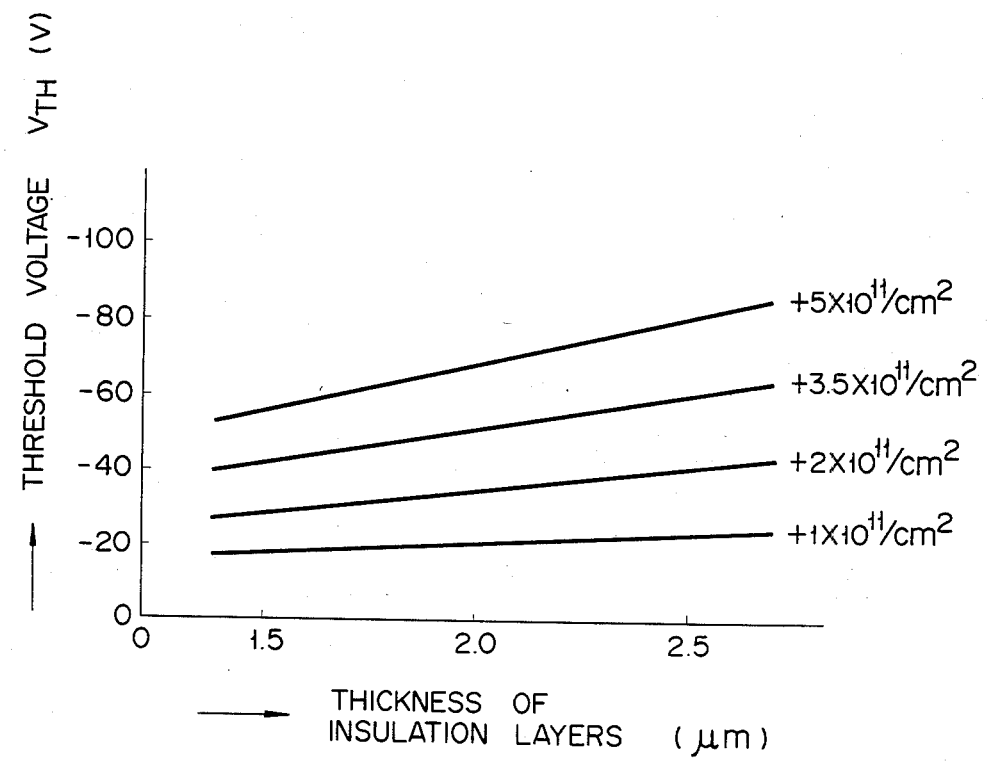
FIG. 15 is a graph showing the relation between the threshold voltage and the thickness of the insulation layers for a conventional device and the device shown in FIG. 1.

FIG. 15 shows the threshold voltage characteristic curves of a conventional device and the device of the invention shown in FIG. 1. Referring to this figure, along the abscissa is plotted the overall thickness of the multi-layered insulation structure consisting of the SiO$_2$ layer 16, the BSG layer 18, PSG layer 20 and the Si$_3$N$_4$ layer 22. The lowermost curve shows the case of the conventional device, and the upper three curves show the case of the device of the present invention. The upper three characteristic curves of the present invention are obtained by changing the parameters, which are the amount of charge on the multi-layered structure. The parameters are: $+5\times 10^{11}$/cm$^2$ for the uppermost curve, $+3.5\times 10^{11}$/cm$^2$ for the second curve from the top and $+3\times 10^{11}$/cm$^2$ for the third curve from the top.

As may be apparent from the figure, a higher threshold voltage can be obtained with a thinner multi-layered insulation structure than in the conventional case.

For example, when the thickness of the multi-layered insulation structure is 2.0 (μm), the threshold voltage is about $-20$ (V) for the conventional semiconductor device. It becomes high in the case of the present invention, for example, as high as $-35$ (V) when the charge amount is $+2\times 10^{11}$/cm$^2$ (the case of the third curve from the top). The threshold voltage V$_{TH}$ becomes greater, about 53 (V) and 70 (V), when the charge amount is $+3.5\times 10^{11}$/cm$^2$ and $+5\times 10^{11}$/cm$^2$, respectively.

Thus, it is seen from FIG. 15 that a higher withstand voltage can be obtained while making the thickness of the multi-layered structure smaller.

Although the description has been made concerning FIG. 15 for the relation between the threshold voltage and the thickness of an insulation structure consisting of the SiO$_2$ layer 16, the BSG layer 18, the PSG layer 20 and the Si$_3$N$_4$ layer 22, the effects are substantially the same in the case of an insulation structure consisting of the SiO$_2$ layer 16, the BSG layer 18, the PSG layer 20, and the Al$_2$O$_3$ layer 24. The only difference is that the symbol "+" of the charge amount changes to "−".

Figure 16:
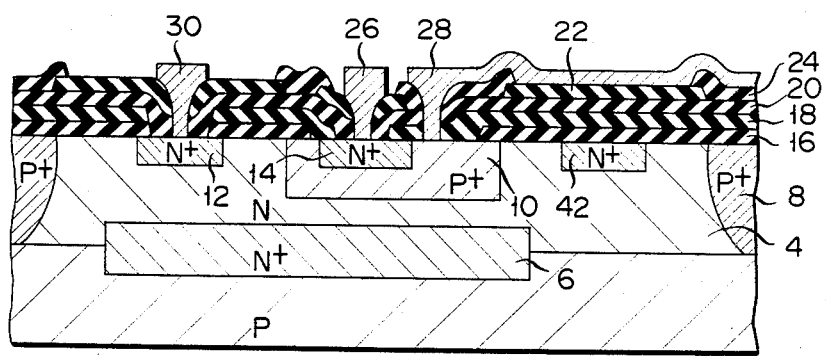
FIG. 16 is a view illustrating a semiconductor device in accordance with another embodiment of the present invention.

FIG. 16 shows another embodiment of the present invention in which the present invention is applied to a bipolar transistor with high breadown voltage. In this embodiment, the structure is the same as in the embodiment shown in FIG. 1, except that a channel stopper n+-type region 42 for cutting an induced channel is formed in the n-type region 4. Thus, the same numerals are used to designate similar parts and the detailed description will be exempted.

Although it is not shown in the drawings, the n+-type collector region 12 and the n+-type channel stopper region 42 are continuous, and they surround the p+-type base region 10 in the direction of the thickness of the device.

In a semiconductor device, in general, a depletion layer extends from around the base-emitter junction when the transistor operates, because the base-collector junction is biased reversely. In the semiconductor device with a high withstand voltage and a channel stopper as shown in FIG. 16, this depletion layer extends within the collector region 4 from the base-collector junction. When this depletion layer extends toward the n+-type channel stopper region, the electric field is concentrated at the depletion layer side of the channel stopper 42 and the device is broken down. The breakdown voltage of the base-emitter junction is essentially determined by the curvature radius of the depletion layer. But, in the device of the present invention shown in FIG. 16, the construction is basically such that an $Si_3N_4$ layer 22 having positive charge is formed over the n-type regions and an $Al_2O_3$ layer having negative charge is formed over the p-type regions. Therefore, the positive charge of the $Si_3N_4$ layer 22 suppresses the extension of the depletion layer in the direction toward the stopper region 42 and causes its extension in the direction of the thickness of the substrate. As a result, the curvature radius of the depletion layer is increased and the breakdown voltage is increased.

Figure 17:
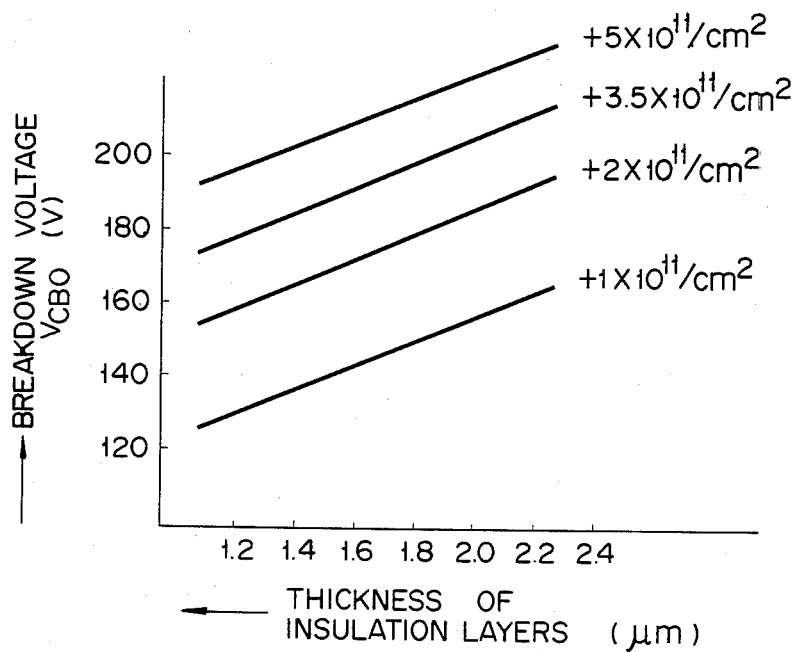
FIG. 17 shows the relation between the breakdown voltage and the thickness of the insulation layers for a conventional device and the device shown in FIG. 16.

FIG. 17 shows the relation between the breakdown voltage $V_{CBO}$ and the thickness of the multi-layered structure consisting of the $SiO_2$ layer 16, the BSG layer 18, the PSG layer 20, and the $Si_3N_4$ layer 22 for a conventional semiconductor device and the semiconductor device shown in FIG. 16.

In FIG. 17, the upper three curves are the characteristic curves for the device of the present invention, and the lowermost curve is the characteristic curve for a conventional device.

The upper three characteristics curves for the device of the present invention are obtained by changing the parameters, i.e., the amount of charge on the multi-layered insulation structure as a whole. The parameters are: $+5 \times 10^{11}/cm^2$ for the uppermost curve, $+3.5 \times 10^{11}/cm^2$ for the second curve from the top, and $+2 \times 10^{11}/cm^2$ for the third curve from the top.

It is seen from FIG. 17 that a higher breakdown voltage $V_{CBO}$ can be obtained with a smaller overall thickness of the layers in the semiconductor device of the present invention. That is, a higher breakdown voltage can be obtained with a smaller overall thickness of the insulation. For example, when the thickness of the insulation layers is 1.6 ($\mu m$), the obtainable breakdown voltage $V_{CBO}$ is only about 143 (V) with the conventional semiconductor device but is about 173 (V) according to the third characteristic curve from the top (charge amount is $+2 \times 10^{11}/cm^2$) for the semiconductor device of the present invention. Further, when the charge amount is $+3.5 \times 10^{11}/cm^2$ or $+5 \times 10^{11}/cm^2$, and when the thickness of the multi-layered insulation structure is 1.6 ($\mu m$), a breakdown voltage of about 192 (V) or 207 (V) respectively, is obtainable.

Although the description concerning FIG. 17 has been made for a multi-layered structure consisting of the $SiO_2$ layer 16, the BSG layer 18, the PSG layer 20 and the $Si_3N_4$ layer 22, the effects are substantially the same for a multi-layered structure consisting of the $SiO_2$ layer 16, the BSG layer 18, the PSG layer 20 and the $Al_2O_3$ layer 24. The only difference is that the symbol "+" of the charge amount changes to "−".

In summary, in accordance with the present invention, a semiconductor device wherein the formation of inversion layers is prevented at the p-type and the n-type regions, the generation of leakage current is prevented, and the reliability and the withstand voltage characteristics are improved is provided by forming an insulation layer which has a high blocking performance against external impurities and has negative charge on the p-type regions of the semiconductor body and forming an insulation layer which has a high blocking performance against external impurities and has positive charge on the n-type regions through an insulation layer of a small amount of charge in each case.

What we claim is:

1. A planer type semiconductor device comprising:
   a semiconductor body of a first conductivity type having an exposed surface;
   a first semiconductor region of a second conductivity type formed in and extending to the exposed surface of said semiconductor body to form an exposed surface and to form an exposed P-N junction;
   a second semiconductor region of the first conductivity type formed in and extending to the exposed surface of said first semiconductor region;
   a $SiO_2$ film formed on the exposed surfaces of said semiconductor body and first semiconductor region, with said $SiO_2$ film covering said exposed P-N junction formed between said semiconductor body and said first semiconductor region;
   a first insulation structure formed on the area of said $SiO_2$ film which is on said exposed surface of said semiconductor body, the first insulation structure having a first polarity of charge opposite the polarity of said first conductivity type;
   a second insulation structure formed on the area of said $SiO_2$ film which is on the exposed surface of said first semiconductor region, the second insulation structure having a second polarity of charge opposite the polarity of said second conductivity type;
   a first electrode formed on said second semiconductor region; and
   a second electrode formed on said first semiconductor region and extending over said first and second insulation structures.

2. A planer type semiconductor device according to claim 1, further including a channel stopper region of the first conductivity type and formed in said semiconductor body, the channel stopper region being of a high impurity concentration and surrounding said first semiconductor region.

3. A planer type semiconductor device according to claim 1, wherein said first insulation structure comprises a silicon nitride layer.

4. A planer type semiconductor device according to claim 1, wherein said first insulation structure comprises a silicon nitride layer and an intervening boron silicate glass layer between said silicon nitride layer and said $SiO_2$ film.

5. A planer type semiconductor device according to claim 1, wherein said first insulation structure comprises a silicon nitride layer and an intervening phosphor silicate glass layer between said silicon nitride layer and said $SiO_2$ film.

6. A planer type semiconductor device according to claim 1, wherein said first insulation structure comprises a silicon nitride layer and a first intervening boron silicate glass layer and a second phosphor silicate glass layer both between said silicon nitride layer and said $SiO_2$ film.

7. A planer type semiconductor device according to claim 1, wherein said first insulation structure comprises a boron silicate glass layer formed on said $SiO_2$ film, a phosphor silicate glass layer formed on said boron silicate glass layer and a silicon nitride layer formed on said phosphor silicate glass layer.

8. A planer type semiconductor device according to claim 1, wherein said second insulation structure comprises an aluminum oxide layer.

9. A planer type device according to claim 1, wherein second insulation structure comprises an aluminum oxide layer and an intervening boron silicate glass layer between said aluminum oxide layer and said SiO$_2$ film.

10. A planer type semiconductor device according to claim 1, wherein said second insulation structure comprises an aluminum oxide layer and an intervening phosphor silicate glass layer between said aluminum oxide layer and said SiO$_2$ film.

11. A planer type semiconductor device according to claim 1 wherein said second insulation structure comprises an aluminum oxide layer and a first intervening boron silicate glass layer and a second phosphor silicate glass layer both between said aluminum oxide layer and said SiO$_2$ film.

12. A planer type semiconductor device according to claim 1, wherein said second insulation structure comprises a boron silicate glass layer formed on said SiO$_2$ film, a phosphor silicate glass layer formed on said boron silicate glass layer and an aluminum oxide layer formed on said phosphor silicate glass layer.

* * * * *